United States Patent
Orii et al.

(10) Patent No.: US 7,354,484 B2
(45) Date of Patent: Apr. 8, 2008

(54) LIQUID PROCESSING APPARATUS AND LIQUID PROCESSING METHOD

(75) Inventors: Takehiko Orii, Nirasaki (JP); Masahiro Mukoyama, Nirasaki (JP); Hiromitsu Nanba, Tosu (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 11/892,429

(22) Filed: Aug. 22, 2007

(65) Prior Publication Data

US 2008/0006299 A1 Jan. 10, 2008

Related U.S. Application Data

(62) Division of application No. 10/409,615, filed on Apr. 9, 2003, now Pat. No. 7,275,553.

(30) Foreign Application Priority Data

Apr. 16, 2002 (JP) .............. 2002-113210

(51) Int. Cl.
- *B08B 5/04* (2006.01)
- *B08B 9/00* (2006.01)
- *B08B 9/027* (2006.01)
- *B08B 3/00* (2006.01)

(52) U.S. Cl. .................. 134/21; 134/22.11; 134/22.12; 134/26; 134/36

(58) Field of Classification Search .................. 134/21, 134/22.1, 22.12, 26, 36, 94.1, 95.1, 95.2, 134/95.3, 99.1, 100.1, 102.1, 102.2, 104.1
See application file for complete search history.

(56) References Cited

U.S. PATENT DOCUMENTS 6,054,181 A 4/2000 Nanbu et al.
6,063,190 A 5/2000 Hasebe et al.
6,863,741 B2 3/2005 Orii et al.
2002/0023664 A1 2/2002 Brunner

FOREIGN PATENT DOCUMENTS

| JP | 08-130202 | 5/1996 |
|----|-----------|--------|
| JP | 09-330904 | 12/1997 |
| JP | 10-144642 | 5/1998 |
| JP | 10-247634 | 9/1998 |
| JP | 10-270336 | 10/1998 |
| JP | 10-340875 | 12/1998 |
| JP | 11-218236 | 8/1999 |
| JP | 2000-012504 | 1/2000 |

*Primary Examiner*—Michael Barr
*Assistant Examiner*—Rita R Patel
(74) *Attorney, Agent, or Firm*—Smith, Gambrell & Russell, LLP

(57) ABSTRACT

A cleaning processing apparatus comprises a spin chuck for holding a wafer W, an under plate being positioned to face the back surface of the wafer W with a prescribed gap provided therebetween, a support member for supporting the under plate, and a nozzle hole formed to extended through the plate member and the support member. A chemical liquid, a pure water and a gas can be supplied into a nozzle hole through opening-closing valves, and the chemical liquid and the pure water remaining inside the nozzle hole can be sucked by a sucking device. A pure water remaining inside the nozzle hole is sucked and removed by using the sucking device after the processing of the wafer W with a pure water and, then, a gas is spurted onto the back surface of the wafer W.

7 Claims, 10 Drawing Sheets

LIQUID PROCESSING APPARATUS AND LIQUID PROCESSING METHOD

CROSS REFERENCE TO RELATED APPLICATION

This application is a division of Ser. No. 10/409,615, filed Apr. 9, 2003 now U.S. Pat. No. 7,275,553, and is being incorporated in its entirety herein by reference.

BACKGROUND OF THE INVENTION

1. Field of the Invention

The present invention relates to a liquid processing apparatus and a liquid processing method for applying a liquid processing such as a cleaning processing to various substrates such as a semiconductor wafer and an LCD substrate.

2. Description of the Related Art

In, for example, the manufacturing process of a semiconductor device, used is a wafer cleaning apparatus for cleaning a semiconductor wafer with a chemical liquid or a pure water so as to remove the particles, organic contaminants, and metal impurities attached to the wafer and to remove, for example, polymers after the etching processing.

As a wafer cleaning apparatus, known is a so-called "single wafer type cleaning apparatus", in which a chemical liquid is supplied onto the front and back surfaces of a wafer, which is held on a spin chuck in substantially a horizontal posture, under the state that the wafer is left stationary or is rotated so as to carry out a processing with the chemical liquid, followed by supplying a pure water onto the wafer while rotating the wafer at a prescribed rotating speed and subsequently discharging a drying gas such as a nitrogen gas ($N_2$) onto the wafer while rotating the wafer.

A discharging nozzle is used for a cleaning processing in the single wafer type cleaning apparatus. The discharging nozzle includes, for example, a circular plate and a nozzle hole formed to extend through the circular plate. The circular plate is arranged to face, for example, the back surface of the wafer, and a chemical liquid, a pure water and a drying gas are successively supplied from the nozzle hole into the gap between the wafer and the circular plate thereby cleaning the back surface of the wafer.

It should be noted that an unused chemical liquid is left inside the nozzle hole after the discharging of the chemical liquid from the nozzle hole of the discharging nozzle. The chemical liquid left within the nozzle hole is extruded into the gap between the wafer and the circular plate when a pure water is discharged in the subsequent step from the nozzle hole. The unused chemical liquid thus extruded from the nozzle hole is mixed with the used chemical liquid and the pure water so as to drop from the circular plate, or to be centrifugally removed from the wafer when the wafer is rotated. Then, the chemical liquid is recovered. It should be noted that the chemical liquid thus recovered is diluted with the pure water. In addition, a large amount of particles are contained in the recovered chemical liquid. It follows that great expenses are needed for the purifying treatment required for the reuse of the recovered chemical liquid.

It should also be noted that a pure water remains inside the nozzle hole of the discharging nozzle after discharging of the pure water from the nozzle hole to the wafer. If a nitrogen gas is spurted from the nozzle hole under this state, most of the pure water remaining inside the nozzle hole is extruded by the drying gas when the spurting of the drying gas is started. However, since the nozzle hole is arranged to extend in the vertical direction, the pure water remaining inside the nozzle hole is affected by the gravity and, thus, is unlikely to be discharged completely. It follows that the pure water is partly attached to wall of the nozzle hole. If the drying gas is spurted from the nozzle hole under the state that the pure water is partly attached to the wall of the nozzle hole, the pure water is converted into a mist by the vigorous stream of the drying gas. Naturally, the mist is spurted toward the water together with the drying gas. If the mist is attached to that portion of the wafer which has already been dried, a water mark is generated so as to degrade the wafer.

BRIEF SUMMARY OF THE INVENTION

A first object of the present invention is to provide a liquid processing apparatus and a liquid processing method which permit efficiently recovering the unused process liquid. Another object of the present invention is to provide a liquid processing apparatus and a liquid processing method which permit suppressing the water mark generation on the substrate.

According to a first aspect of the present invention, there is provided a liquid processing apparatus for supplying a process liquid onto a substrate so as to carry out a liquid processing, comprising:

holder for holding a substrate in substantially a horizontal posture;

a discharging nozzle for discharging a process liquid onto the substrate held by the holder;

a process liquid supply mechanism for supplying a process liquid into the discharging nozzle; and a process liquid sucking mechanism for sucking and removing the process liquid remaining inside the discharging nozzle after the process liquid is discharged from the discharging nozzle onto the substrate held by the holder.

It is desirable for the liquid processing apparatus of the present invention to comprise further a process gas supply mechanism for supplying a process gas into the discharging nozzle, and a switching mechanism for switching the process fluid such that one of a process liquid and a process gas is supplied from the process liquid supply mechanism and the process gas supply mechanism into the discharging nozzle.

According to a second aspect of the present invention, there is provided a liquid processing method for supplying a process liquid onto a substrate so as to carry out a liquid processing, comprising the steps of:

discharging a process liquid from a discharging nozzle for discharging a process liquid and a drying gas onto the substrate thereby applying a liquid processing to a substrate; and sucking and removing the process liquid remaining inside the discharging nozzle after the process liquid is discharged from the discharging nozzle.

It is possible for the liquid processing method of the present invention to comprise further the step of discharging a drying gas from the discharging nozzle thereby drying the substrate after removal of the process liquid from inside the discharging nozzle.

According to the liquid processing apparatus and the liquid processing method of the present invention, the process liquid remaining inside the nozzle hole of the discharging nozzle for discharging the process liquid is removed by vacuum suction. It should be noted that the process liquid removed by vacuum suction is unused and, thus, has a high concentration. Naturally, the particle content of the sucked process liquid is low. It follows that the process liquid removed by vacuum suction can be reused easily. It should also be noted that, if the process liquid remaining inside the nozzle hole is removed by vacuum suction, it is possible to eliminate substantially completely the process liquid attached to the wall of the nozzle hole. As a result, even if a gas is spurted in the subsequent step from the nozzle hole, the process liquid is prevented from forming a mist, thereby suppressing the water mark generation on the substrate.

DETAILED DESCRIPTION OF THE INVENTION

Some embodiments of the present invention will now be described in detail with reference to the accompanying drawings. The following description covers the case where the technical idea of the present invention is applied to a cleaning process unit, which permits carrying out the cleaning processing on both the front surface and the back surface of a wafer simultaneously, and which is mounted to a cleaning processing system in which the transfer of a wafer into the system, the cleaning/drying processing, and the transfer of the wafer out of the system are carried out consistently.

Figure 1:
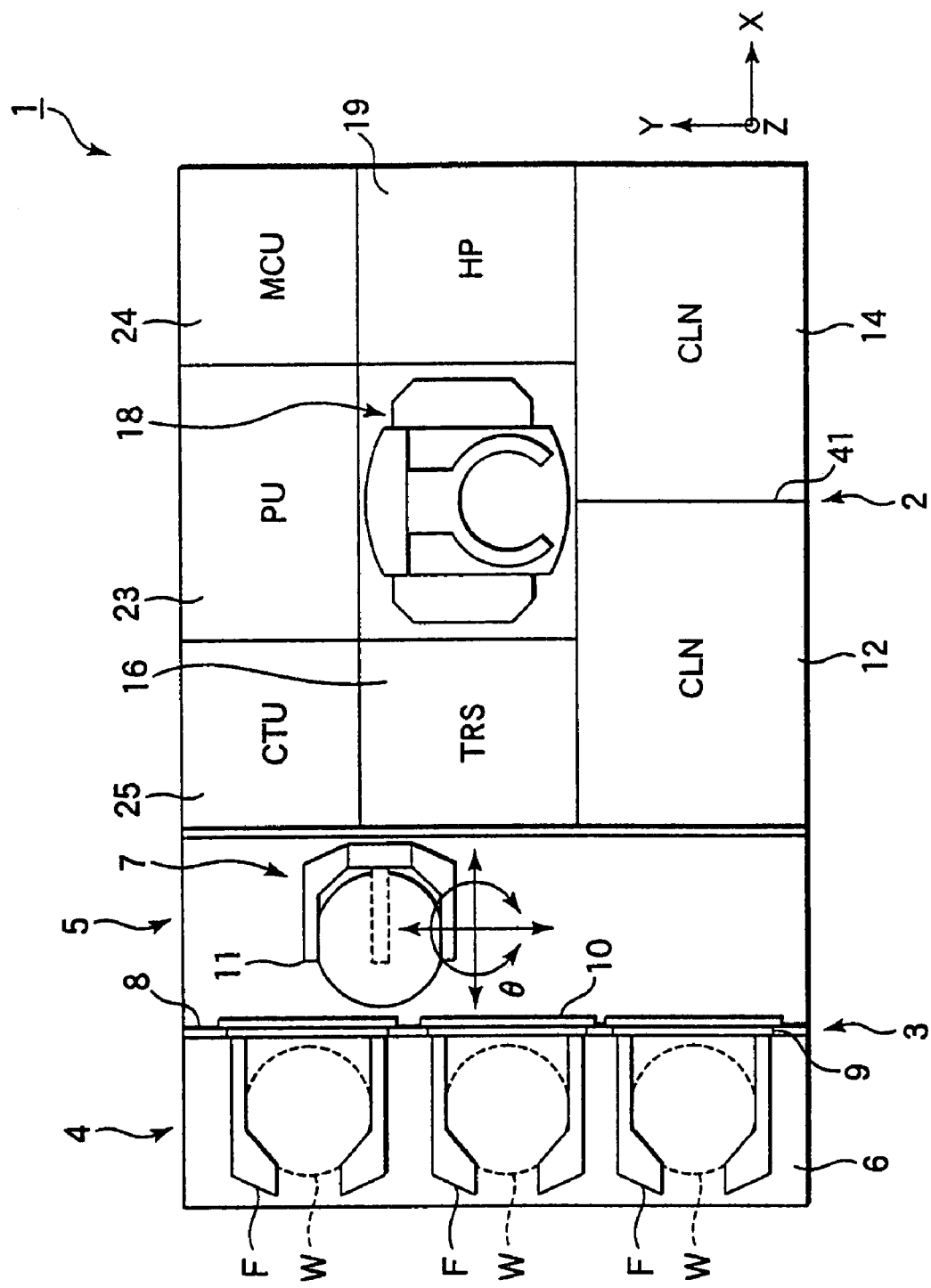
FIG. 1 is a plan view schematically showing the construction of a cleaning processing system equipped with a cleaning processing unit according to one embodiment of the present invention.
Figure 2:
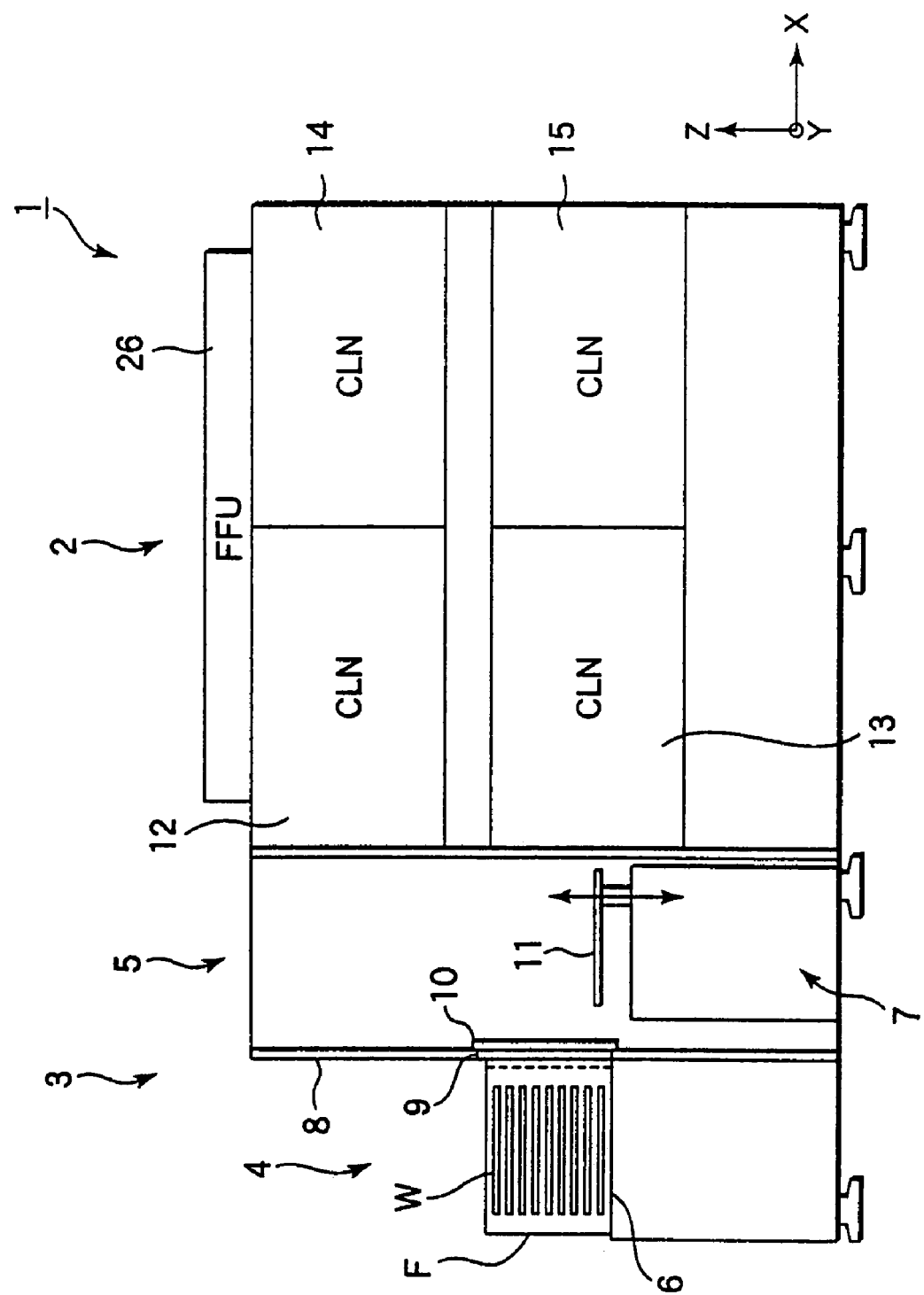
FIG. 2 is a side view schematically showing the construction of the cleaning processing system shown in FIG. 1.

FIG. 1 is a plan view schematically showing the construction of a cleaning processing system 1, and FIG. 2 is a side view of the cleaning processing system 1 shown in FIG. 1. The cleaning processing system 1 comprises a cleaning processing portion 2 for applying a cleaning processing to the wafer W and a thermal treatment to the wafer W after the cleaning processing, and a loading/unloading portion 3 for loading and unloading the wafer into and out of the cleaning processing portion 2. The loading/unloading portion 3 includes an in-out port 4 and a wafer transfer portion 5.

Arranged in the in-out port 4 is a table 6 on which are disposed FOUPs (front opening unified pod) F each for housing a plurality of wafers W, e.g., 25 wafers W, in substantially a horizontal posture a prescribed distance apart from each other in the vertical direction. On the other hand, the wafer transfer portion 5 is equipped with a wafer transfer device 7 for transferring the wafer W between the FOUP F disposed on the table 6 and cleaning processing portion 2.

A wafer delivery port for delivering the wafer W, which can be closed by a lid, is formed through one side wall of the FOUP F. A rack plate for holding the wafers W a prescribed distance apart from each other is formed on the inner wall of the FOUP F so as to define 25 slots for housing the wafers W. A single wafer W is housed in each slot under the state that the front surface of the wafer W, on which a semiconductor device is formed, constitutes the upper surface when the wafer W is held horizontal.

A plurality of FOUPs F, e.g., three FOUPs F, which are arranged in the Y-direction, can be disposed on the table 6. The FOUP F is disposed such that the side surface of the FOUP on which the lid is arranged is allowed to face a partitioning boundary wall 8 separating the in-out port 4 from the wafer transfer portion 5. A window 9 is formed in that portion of the boundary wall 8 which corresponds to the position where the FOUP F is disposed. Also, a shutter 10 for opening and closing the window 9 is formed on the side of the wafer transfer portion 5 of the window 9.

The shutter 10 is also capable of moving the lid mounted to the FOUP F so as to open or close the delivery port of the FOUP F. In other words, the shutter 10 opens or closes the delivery port of the FOUP F when the window 9 is opened or closed. It is desirable to mount an interlocking mechanism in the shutter 10 in order to prevent the shutter 10 from being operated when the FOUP F is not disposed on a prescribed position on the table 6. If the window 9 is opened so as to permit the delivery port of the FOUP F to communicate with the wafer transfer portion 5, the wafer transfer device 7 is rendered capable of gaining access to the interior of the FOUP F so as to make it possible to transfer the wafer W.

Incidentally, a wafer inspecting device (not shown) is arranged in an upper portion of the window 9. The wafer inspecting device includes a sensor that can be moved in the vertical direction so as to detect the number wafers W housed in the FOUP F and state of the wafer W for every slot. It is possible to mount the wafer inspecting device to the shutter 10.

The wafer transfer device 7 can be moved in the Y-direction. Also, the wafer transfer device 7 includes a transfer pick 11 for holding the wafer W. The transfer pick 11 is slidable in the X-direction, movable in the Z-direction, and swingable in the X-Y plane (in the θ direction). As a result, it is possible to move the wafer transfer device 7 to a position facing an optional FOUP F disposed on the table 6 so as to permit the transfer pick 11 to gain access to the slot having an optional height of the FOUP F, said slot facing the transfer pick 11.

Figure 3:
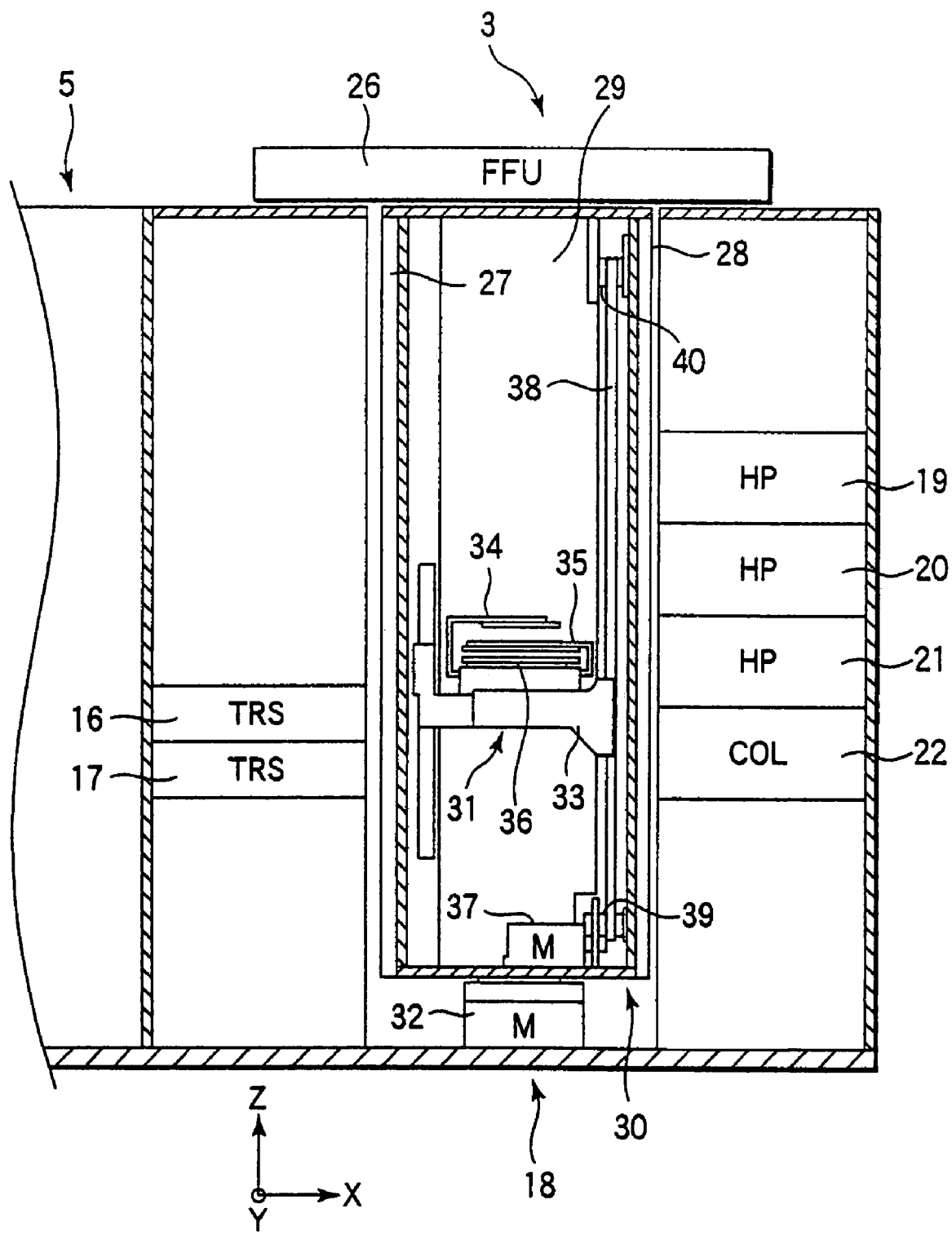
FIG. 3 is a cross sectional view schematically showing the construction of the cleaning processing system shown in FIG. 1.

It is possible to move the wafer transfer device 7 to a position facing two wafer delivery units (TRS) 16, 17 (the position of the wafer delivery unit (TRS) 17 being shown in FIG. 3) so as to permit the transfer pick 11 to gain access to the wafer delivery units (TRS) 16, 17. In other words, the wafer transfer device 7 permits transferring the wafer W into and out of the FOUP F, permits transferring the wafer W from the cleaning processing portion 2 into the transfer portion 3, and also permits transferring the wafer W from the transfer portion 3 into the cleaning processing portion 2.

The cleaning processing portion 2 includes the two wafer delivery units (TRS) 16, 17 for having the wafer W temporarily disposed thereon for the delivery of the wafer W to and from the wafer transfer portion 5, four cleaning processing units (CLN) 12, 13, 14, 15 for simultaneously cleaning the front surface and the back surface of the wafer W, three hot plate units (HP) 19, 20, 21 (the positions of the hot plate units (HP) 20 and 21 being shown in FIG. 3) for heating the cleaned wafer W, a cooling unit (COL) 22 (the position of the cooling unit (COL) 22 being shown in FIG. 3) for cooling the heated wafer W, and a main wafer transfer device 18 capable of gaining access to all of these process units so as to transfer the wafer W among these process units.

Also, arranged in the cleaning processing portion 2 are a power source unit (PU) 23 providing a power source for operating the entire cleaning processing system 1, a mechanical control unit (MCU) 24 for operating and controlling each of the process units constituting the cleaning processing system 1 and for operating and controlling the entire cleaning processing system 1, and a chemical liquid storing unit (CTU) storing a chemical liquid that is supplied into the cleaning processing units (CLN) 12 to 15. The power source unit (PU) 23 is connected to a main power source (not shown). Further, a fan filter unit (FFU) 26 for supplying a down flow of a clean air into each of the process units and the main wafer transfer device 18 is formed in the ceiling of the cleaning processing portion 2.

Incidentally, it is possible to arrange the chemical liquid storing unit (CTU) 25, the power source unit (PU) 23 and the mechanical control unit (MCU) 24 outside the cleaning processing portion 2. Alternatively, it is desirable for these units 24, 23 and 24 to be capable of being withdrawn to the outside of the cleaning processing portion 2. As a result, it is possible to apply a maintenance operation easily to the wafer delivery units (TRS) 16, 17, the main wafer transfer device 18, the hot plate units (HP) 19 to 21, and the cooling unit (COL) 22 from the side surface in the Y-direction.

FIG. 3 is a cross sectional view schematically showing the construction of the cleaning processing system 1. Schematically shown in the drawing is the arrangement of the wafer delivery units (TRS) 16, 17, the main wafer transfer device 18 positioned adjacent to the wafer delivery units (TRS) 16, 17 in the X-direction, the hot plate units (HP) 19 to 21, and the cooling unit (COL) 22. The wafer delivery units (TRS) 16 and 17 are stacked one upon the other to form a two-stage structure. For example, the wafer W transferred from the wafer transfer portion 3 into the cleaning processing portion 2 is disposed temporarily on the lower stage wafer delivery unit (TRS) 17. On the other hand, the wafer W transferred from the cleaning processing portion 2 into the wafer transfer portion 3 is disposed temporarily on the upper stage wafer delivery unit (TRS) 16.

The down flow of a clean air supplied from the fan filter unit (FFU) 26 flows partly into the wafer delivery units (TRS) 16, 17 and partly into the wafer transfer portion 5 through the free space above the wafer delivery units (TRS) 16, 17). As a result, particles or the like generated in the wafer transfer portion 5 are prevented from entering the cleaning processing portion 2 so as to maintain a high cleanliness within the cleaning processing portion 2.

The main wafer transfer device 18 includes vertical walls 27, 28 extending in the Z-direction, a cylindrical support body 30 having a side open portion 29 positioned between the vertical walls 27 and 28, and a wafer transfer body 31 vertically movable in the Z-direction along the inside of the cylindrical support body 30. The cylindrical support-body 30 can be rotated by a motor 32. Also, the wafer transfer body 31 can be rotated integrally in accordance with rotation of the cylindrical support body 30.

The wafer transfer body 31 includes a transfer base 33 and three transfer arms 34, 35, 36 movable back and forth in the horizontal direction along the transfer base 33. Each of these transfer arms 34 to 36 is sized small enough to pass through the side open portion 29 of the cylindrical support body 30. Also, these transfer arms 34 to 36 can be moved back and forth independently by a motor housed in the transfer base 33 and a belt mechanism. The wafer transfer body 31 can be moved upward by allowing a motor 37 to drive a belt 38. Incidentally, a reference numeral 39 shown in FIG. 3 represents a driving pulley, and a reference numeral 40 represents a driven pulley.

The three hot plate units (HP) 19 to 21 are stacked one upon the other on the cooling unit (COL) 22 for performing a compulsory cooling of the wafer W. Incidentally, it is possible to arrange the hot plate units (HP) 19 to 21 and the cooling unit (COL) 22 in the free space above the wafer delivery units (TRS) 16 and 17. In this case, the space occupied by the hot plate units (HP) 19 to 21 and the cooling unit (COL) 22, which is shown in FIGS. 1 and 3, can be utilized as another utility space.

The cleaning processing units (CLN) 13 and 15 are arranged side by side, and the other cleaning processing units (CLN) 12 and 14 are stacked on the cleaning processing units (CLN) 13 and 15, respectively, so as to provide a two-stage structure. The cleaning processing unit (CLN) 12 and the cleaning processing unit (CLN) 14 are substantially in symmetry in construction with respect to a wall plane 41 constituting the boundary between the cleaning processing units (CLN) 12 and 14. This is also the case with the cleaning processing unit (CLN) 13 and the cleaning processing unit (CLN) 15. Also, the cleaning processing units (CLN) 12 to 15 are substantially equal to each other in the construction (constituting members and the function). Such being the situation, the construction of the cleaning processing unit (CLN) 12, which is taken up as an example, will now be described in detail.

Figure 4:
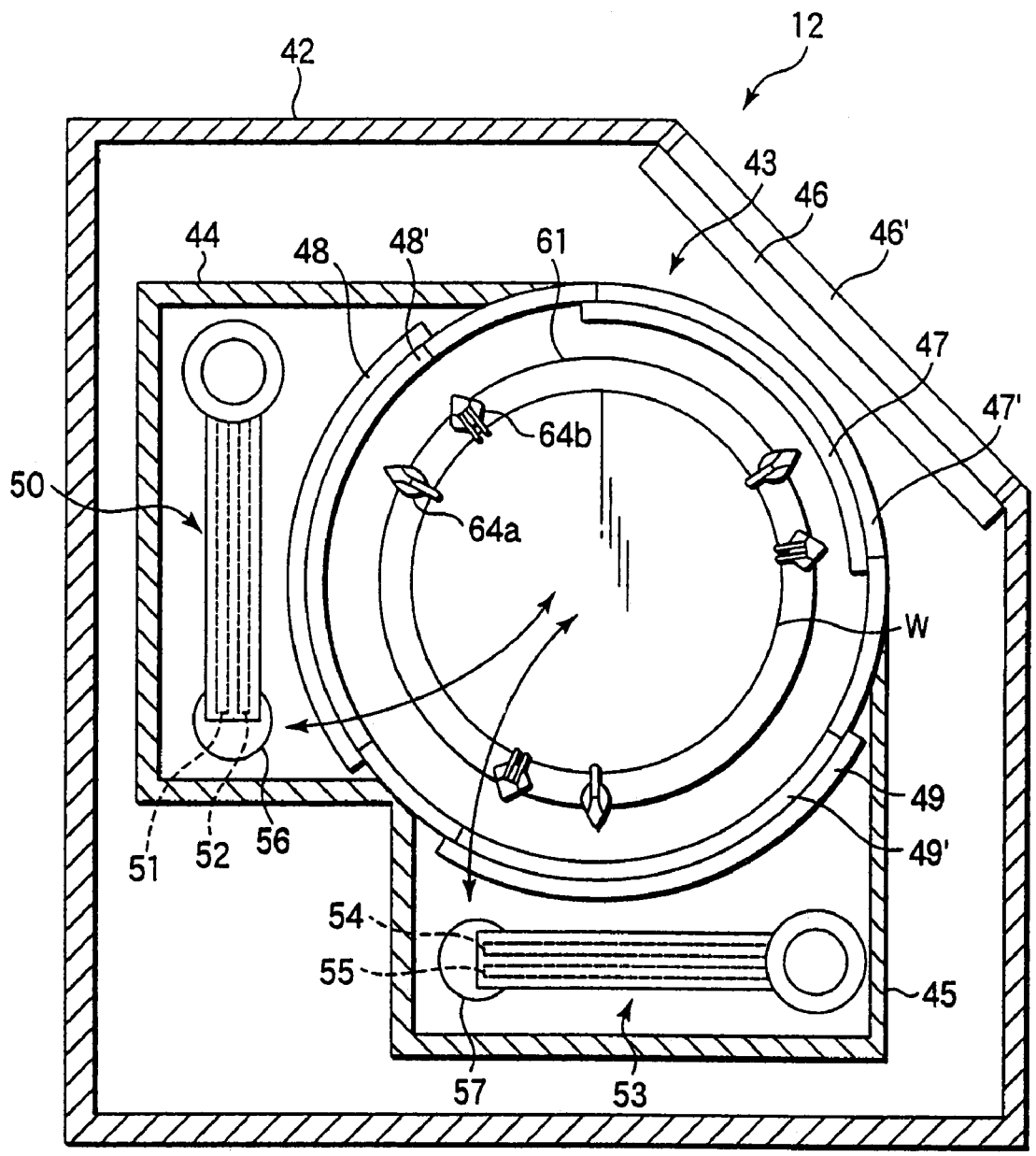
FIG. 4 is a plan view schematically showing the construction of the cleaning processing unit.
Figure 5:
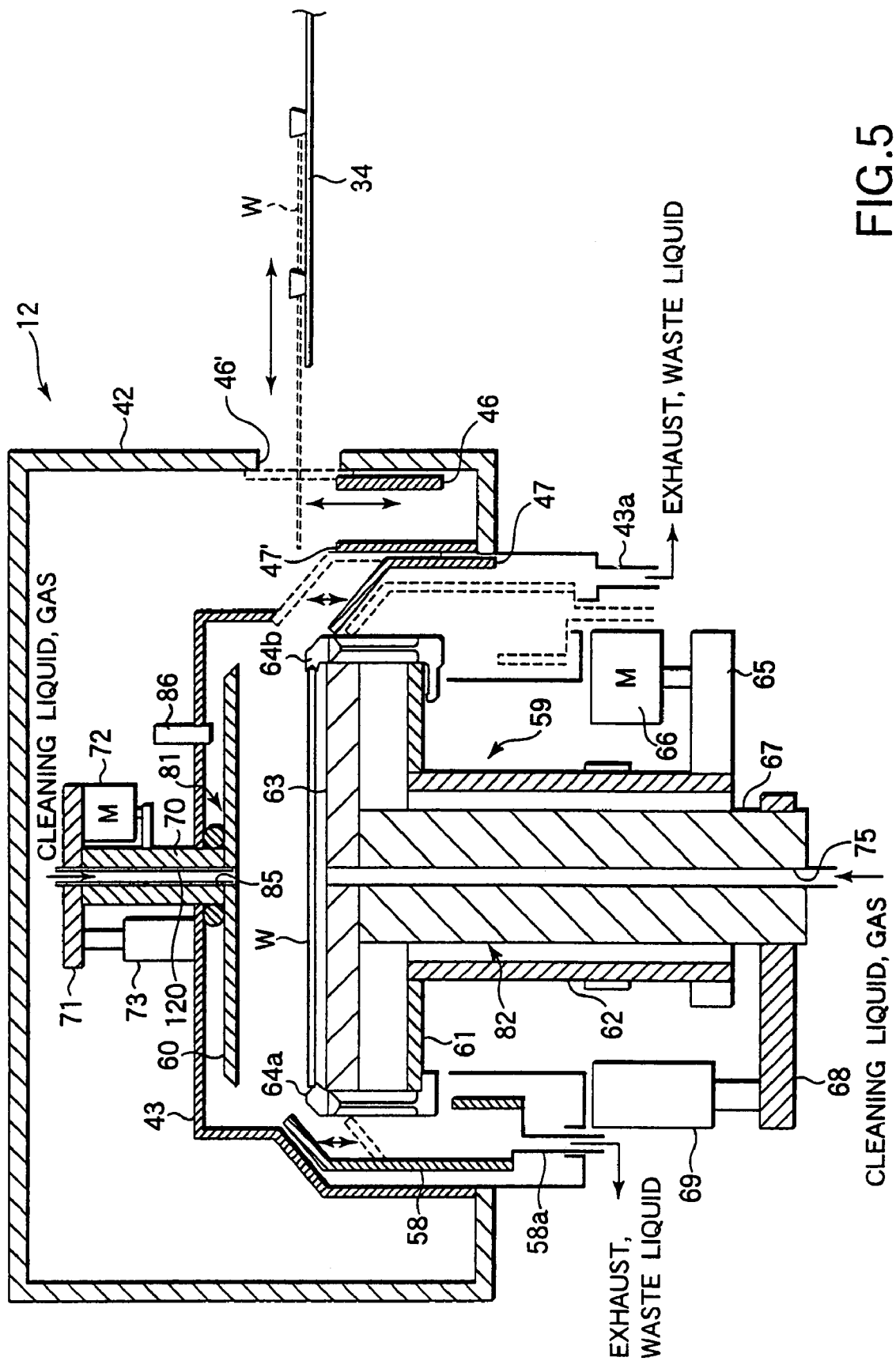
FIG. 5 is a cross sectional view schematically showing the construction of the cleaning processing unit.

FIG. 4 is a plan view schematically showing the construction of the cleaning processing unit (CLN) 12, and FIG. 5 is a cross sectional view schematically showing the construction of the cleaning processing unit (CLN) 12. As shown in the drawings, the cleaning processing unit (CLN) 12 includes a housing 42. An outer chamber 43, a housing portion 44 for housing an arm 50 for holding chemical liquid supply nozzles 51, 52, and a housing portion 45 for housing an arm 53 for holding rinse-drying nozzles 54, 55 are formed inside the housing 42. Also, arranged inside the outer chamber 43 are an inner cup 58, a spin chuck 59 holding the wafer W inside the inner cup 58, a discharging nozzle 81 for cleaning the front surface of the wafer W held by the spin chuck 59 and a discharging nozzle 82 for cleaning a back surface of the wafer W held by the sin chuck 59.

A window portion 46', which can be opened and closed by a first shutter 46, is formed in the housing 42. A mechanism for driving the first shutter 46 is not shown in any of FIGS. 4 and 5. The transfer arm 34 (or 35, 36) transfers the wafer W into the cleaning processing unit (CLN) 12 through the window portion 46', and the window portion 46' is kept closed by the first shutter 46 except the time when the wafer W is transferred into or out of the cleaning processing unit (CLN) 12. Incidentally, the first shutter 46 opens or closes the window portion 46' from within the housing 42. Therefore, when the pressure inside the housing 42 is rendered higher than the atmospheric pressure, the atmosphere within the housing 42 is unlikely to leak to the outside.

The cleaning processing is applied to the wafer W within the outer chamber 43. A window portion 47', which can be opened and closed by a second shutter 47 that is moved by, for example, a cylinder driving mechanism (not shown), is formed in the outer chamber 43. The transfer arm 34 (or 35, 36) holding the wafer W is moved into or out of the outer chamber 43 through the window portion 46' and the window portion 47' so as to deliver the wafer W onto the spin chuck 59. It should be noted that the window portion 47' is kept closed except the time when the wafer W is delivered onto or out of the spin chuck 59.

Since the second shutter 47 opens or closed the window portion 47' from within the outer chamber 43, the atmosphere within the outer chamber 43 is unlikely to leak to the outside even in the case where the pressure within the outer chamber 43 is rendered higher than the atmospheric pressure. Incidentally, it is possible to drive the first shutter 46 and the second shutter 47 by a common driving mechanism so as to open or close simultaneously the window portion 46' and the window portion 47'.

A gas supply port 86 for supplying an inert gas such as a nitrogen gas ($N_2$) into the outer chamber 43 is formed through the upper wall of the outer chamber 43. A down flow of a gas is formed within the outer chamber 43 by a gas spurted from the gas supply port 86. As a result, the outer chamber 43 is prevented from being filled with a vapor of the chemical liquid supplied onto the wafer W held by the spin chuck 59. The formation of such a down flow permits producing the effect that a water mark is unlikely to be formed on the surface of the wafer W. Further, a drain 43a, through which the waste gas and the waste liquid are discharged to the outside, is formed in the bottom portion of the outer chamber 43.

The inner cup 58 has an upper tapered portion, and a drain 58a is formed through the bottom wall of the inner cup 58. The inner cup 58 is movable in the vertical direction between the process position denoted by a solid line in FIG. 5, in which the upper end of the inner cup 58 is positioned higher than the wafer W held by the spin chuck 59 and the tapered portion surrounds the wafer W, and the retreat position denoted by a dotted line in FIG. 5, in which the upper end of the inner cup 58 is positioned lower than the wafer W held by the spin chuck 59.

When delivery of the wafer W is carried out between the transfer arm 34 (or 35, 36) and the spin chuck 59, the inner cup 58 is held in the retreat position so as not to obstruct the movement of the transfer arm 34. On the other hand, when a cleaning processing is applied to the wafer W held by the spin chuck 59, the inner cup 58 is held in the process position. As a result, the chemical liquid or the pure water discharged onto the wafer W is prevented from being scattered to the surrounding circumference. Also, the chemical liquid used for the cleaning processing of the wafer W is guided into the drain 58a. A chemical liquid recovery line (not shown) and an exhaust duct (not shown) are connected to the drain 58a, with the result that the mist or the like generated within the inner cup 58 is prevented from being diffused within the outer chamber 43, and the chemical liquid is recovered or discharged as a waste liquid.

The spin chuck 59 includes a rotary plate 61 and rotary cylindrical body 62 connected to the rotary plate 61. Also, a support pin 64a for supporting the wafer W and a holding pin 64b holding the wafer W are mounted to the peripheral portion of the rotary plate 61. The delivery of the wafer W between the transfer arm 34 (or 35, 36) and the spin chuck 59 is carried out by utilizing the support pin 64a. In order to support the wafer W without fail, it is desirable for the support pin 64a to be mounted in at least three points.

In order to prevent the delivery of the wafer W between the transfer arm 34 (or 35, 36) and the spin chuck 59 from being obstructed by the holding pin 64b, the holding pin 64b can be inclined so as to permit that portion of the holding pin 64b which is positioned below the rotary plate 61 to be pushed toward the rotary plate 61 by a pushing mechanism (not shown), thereby moving the upper edge of the holding pin 64b toward the outside of the rotary plate 61. In order to hold the wafer W without fail, it is also desirable for the holding pin 64b to be mounted in at least three points.

A belt 65 is stretched along the outer circumferential surface of the rotary cylindrical body 62. If a motor 66 is rotated, the belt 66 is rotated so as to rotate the rotary cylindrical body 62 and the rotary plate 61, with the result that the wafer W held by the holding pin 64b is also rotated. It is possible to adjust the force with which the wafer W is held by the holding pin 64b during rotation of the wafer W by adjusting the position of the center of gravity of the holding pin 64b. For example, if the center of gravity of the holding pin 64b is located below the rotary plate 61, the centrifugal force is applied to the portion below the rotary plate 61. As a result, the upper edge portion of the holding pin 64b is urged inward so as to increase the force with which the wafer W is held.

The discharging nozzle 82 for cleaning the back surface of the wafer W includes an under plate 63 facing the back surface of the wafer W with a prescribed distance provided therebetween, and a support member 67 for supporting the under plate 63 and a nozzle hole 75 for supplying the chemical liquid, the pure water and the drying gas, e.g., a nitrogen gas, to the back surface of the wafer W. The nozzle hole is formed to extend through the under plate 63 and within the support member 67. The support member 67 extends through the central portion of the rotary plate 61 and within the rotary cylindrical body 62. The support member 67 is fixed to the upper surface of a horizontal plate 68. The horizontal plate 68 and the support member 67 can be moved integrally in the vertical direction by a lift mechanism 69 including, for example, an air cylinder.

When the delivery of the wafer W is carried out between the spin chuck 59 and the transfer arm 34 (or 35, 36), the under plate 63 is moved to a position close to the rotary plate 61 so as to prevent the under plate 63 from colliding against the transfer arm 34. When a cleaning processing is applied to the back surface of the wafer W, the under plate 63 is moved upward to a position close to the back surface of the wafer W held by the holding pin 64b, and a chemical liquid, etc. is discharged through the nozzle hole 75 to the back surface of the wafer W. Incidentally, it is possible to adjust the gap between the wafer W held by the holding pin 64b and the under plate 63 in accordance with the progress of the cleaning processing by moving upward the rotary cylindrical body 62 with the under plate 63 fixed at a prescribed height.

The discharging nozzle 81 for cleaning the front surface of the wafer W includes a top plate 60 facing the front surface of the wafer W with a prescribed distance provided therebetween, a holding member 70 for holding the top plate 60, a hole portion 85 extending in the vertical direction through the top plate 60 and the holding member 70 and a pipe 120 for supplying the chemical liquid, etc. onto the front surface of the wafer W. The pipe 120 is arranged inside of the hole portion 85.

The holding member 70 is rotatably mounted to the lower surface of the horizontal plate 71 so as to be rotated together with the top plate 60 connected to the top plate 60 by a motor 72 mounted to the horizontal plate 71. The horizontal plate 71 can be moved in the vertical direction by a lift mechanism 73 such as an air cylinder fixed to the upper wall of the outer chamber 43.

When the delivery of the wafer W is carried out between the spin chuck 59 and the transfer arm 34 (or 35, 36), the top plate 60 is held in a position close to the upper wall of the outer chamber 43 so as to prevent the top plate 60 from colliding against the transfer arm 34. Also, when a cleaning processing is applied to the front surface (upper surface) of the wafer W, the top plate 60 is moved downward to a position close to the upper surface of the wafer W held by the holding pin 64b, and a chemical liquid, etc. is discharged from the pipe 120 onto the wafer W.

Figure 6:
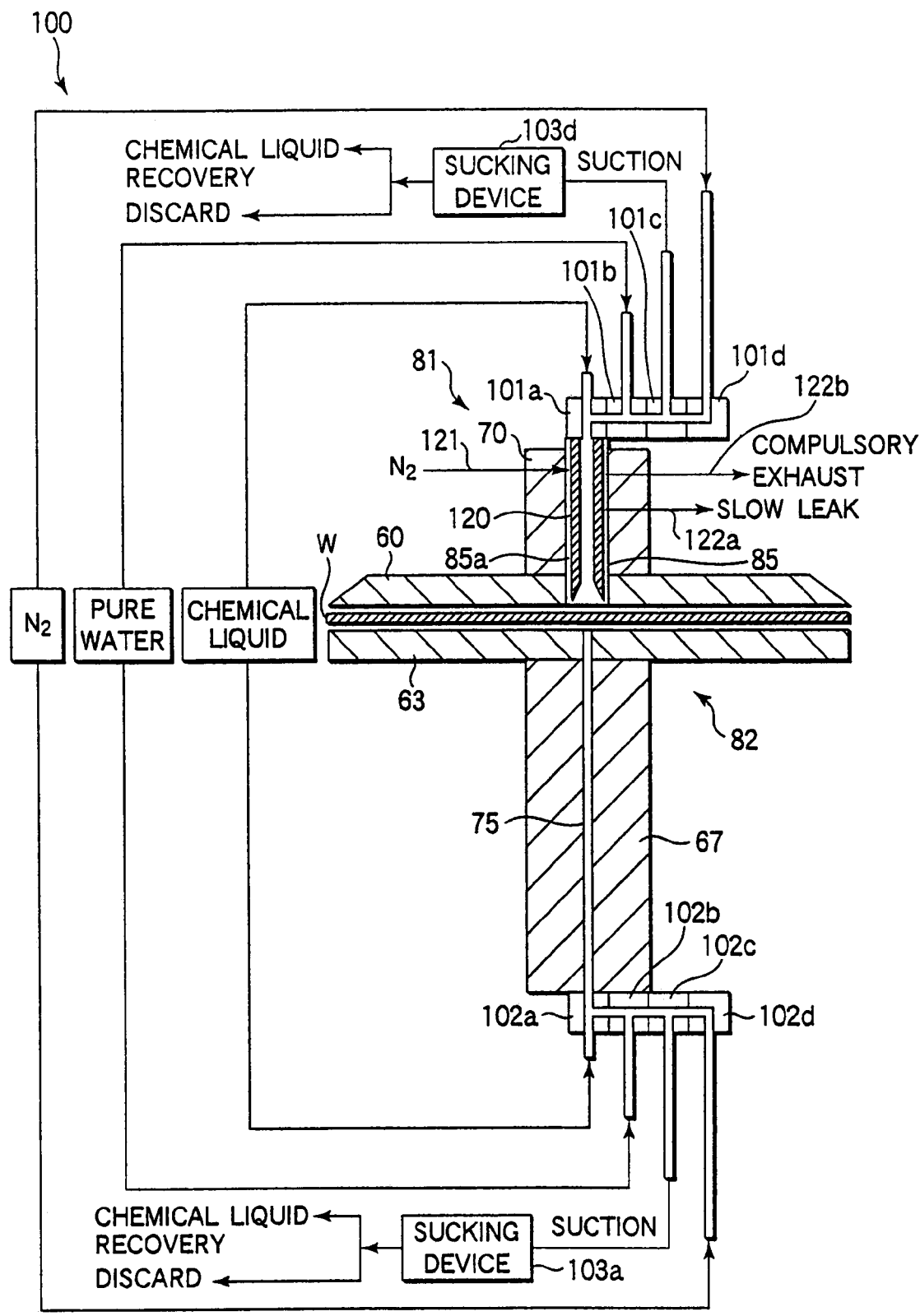
FIG. 6 schematically shows the constructions of a discharging nozzle for cleaning the front surface, a discharging nozzle for cleaning the back surface and a chemical liquid supply system for supplying a chemical liquid into these nozzles.
Figure 7A:
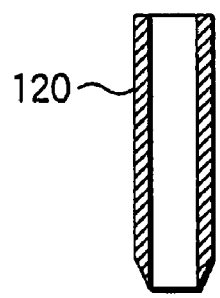
FIGS. 7A to 7D are cross sectional views showing another embodiment of the top plate and the pipe.
Figure 7C:
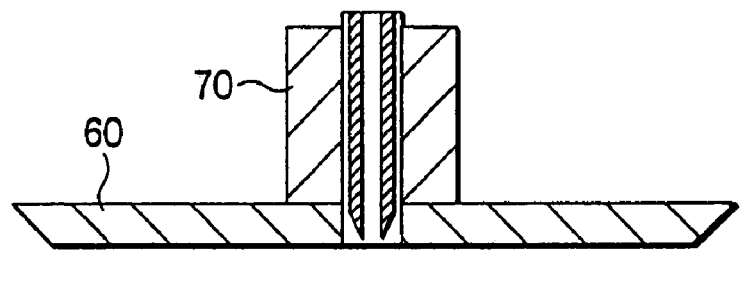
Figure 7B:
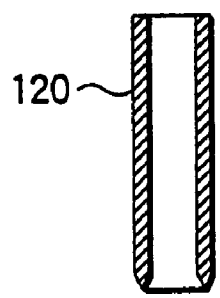
Figure 7D:
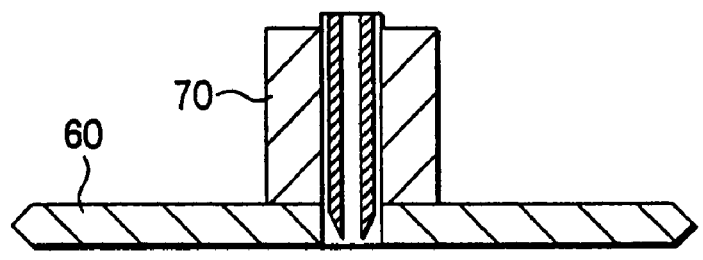

FIG. 6 shows in detail the constructions of the discharging nozzle 81 and the discharging nozzle 82, and schematically shows the construction of a chemical liquid supply system 100 for supplying a chemical liquid, a drying gas, etc. into the nozzle hole 75 and the pipe 120. Incidentally, in FIG. 6, flowing paths of a chemical liquid etc. are shown in respect of opening-closing valves 101a to 101d and opening-closing valves 102a to 102d but the mechanisms for opening/closing these flowing paths are omitted.

As shown in the drawing, four opening-closing valves 102a, 102b, 102c and 102d are mounted in parallel to the nozzle hole 75. Any one of a chemical liquid, a pure water and a nitrogen gas can be supplied into the nozzle hole 75 by switching the opening-closing valves 102a, 102b and 102d among these four opening-closing valves. Also, a sucking device 103a such as an aspirator or a vacuum pump is mounted to a pipe to which the opening-closing valve 102c is mounted. If the sucking device 103 is operated and the opening-closing valve 102c is opened after a chemical liquid or a pure water is supplied into the nozzle hole 75, it is possible to suck the chemical liquid or the pure water remaining inside the nozzle hole 75 so as to remove the remaining chemical liquid or pure water. The chemical liquid thus sucked is recovered so as to be reused.

The four opening-closing valves 101a, 101b, 101c and 101d are mounted in parallel to the pipe 120. It is possible to supply any one of a chemical liquid, a pure water and a nitrogen gas into the pipe 120 by switching the opening-closing valves 101a, 101b and 101d among the four opening-closing valves noted above. Also, a sucking device 103b such as an aspirator or a vacuum pump is mounted to a pipe to which the opening-closing valve 103c is mounted. It is possible to suck and remove the chemical liquid or the pure water remaining inside the pipe 120 by operating the sucking device 103b and opening the opening-closing valve 101c after the chemical liquid or the pure water is supplied into the pipe 120. The chemical liquid thus sucked can be reused.

A nitrogen gas can be supplied through a gas supply pipe 121 into a clearance 85a between the hole portion 85 and the pipe 120 and can be discharged from the clearance 85a to the outside through two gas exhaust pipes 122a (for slow leak) and 122b (for compulsory discharge). The nitrogen gas supplied through the gas supply pipe 121 into the clearance 85a is discharged (slow leak) from the clearance 85a to the outside through the gas exhaust pipe 122a at a prescribed flow rate. Where a layer of a chemical liquid or pure water is formed between the front surface of the wafer W and the top plate 60, the nitrogen gas supply rate into the clearance 85a and the nitrogen gas discharge rate from the clearance 85a through the gas exhaust pipe 122a are set in a manner to prevent the bubbling of the nitrogen gas in the layer of the chemical liquid or the pure water and to prevent the chemical liquid or the pure water from permeating into the clearance 85a.

It is possible to carry out a compulsory gas discharge from the clearance 85a through the gas exhaust pipe 122b. The gas exhaust rate through the gas exhaust pipe 122b is higher than the gas exhaust rate through the gas exhaust pipe 122a. The compulsory gas discharge through the gas exhaust pipe 122b is carried out under the state that the lower end of the clearance 85a is not in contact with the chemical liquid or the pure water. For example, it is possible to prevent the particles generated in the clearance 85a by the rotation of the top plate 60 and the holding member 70 from being attached to the wafer W while preventing the permeation of the chemical liquid or the pure water into the clearance 85a by carrying out a compulsory gas discharge from the clearance 85a through the gas exhaust pipe 122b while rotating the top plate 60 and the holding member 70.

The tip portion of the pipe 120 is wedge-shaped, with the result that the chemical liquid or the pure water is unlikely to be attached to the tip portion of the pipe 120 and, thus, the tip portion of the pipe 120 is unlikely to be stained. As a result, it is possible to prevent the particle generation at the tip of the pipe 120 and to prevent the water mark generation caused by the dripping of a pure water droplet from the pipe 120 during the drying processing of the wafer W.

FIGS. 7A to 7D are a cross sectional view showing the constructions of the pipe 120 and the top plate 60 according to another embodiment of the present invention. In the pipe 120 shown in FIG. 6, the tip portion is wedge-shaped such that the inner diameter of the tip portion of the pipe 120 is gradually increased toward the tip. In the embodiment shown in FIG. 7A, however, the pipe 120 is wedge-shaped such that the inner diameter of the pipe 120 is maintained constant, and the outer diameter in the tip portion of the pipe 120 is gradually decreased toward the tip. On the other hand, in the embodiment shown in FIG. 7B, the tip portion of the pipe 120 is in the shape of a pinnacle of a reversed triangle.

The outer circumferential edge portion of the top plate 60 also has a substantially wedge-shaped cross portion so as to cause the chemical liquid or the pure water to be unlikely to be attached to the outer circumferential edge portion of the top plate 60. In the embodiment shown in FIG. 6, the outer diameter on the upper surface of the top plate 60 is shorter than the outer diameter on the lower surface. In the embodiment shown in FIG. 7C, however, the outer diameter on the upper surface is longer than the outer diameter on the lower surface. Further, in the embodiment shown in FIG. 7D, the upper surface and the lower surface of the top plate 60 are substantially equal to each other, and the intermediate portion in the thickness direction of the top plate 60 has the longest outer diameter so as to form a substantially pinnacle-shaped cross portion. In the embodiment shown in each of FIGS. 7C and 7D, it is also possible to centrifugally remove the chemical liquid and the pure water attached to the top plate 60 when the top plate 60 is rotated, thereby suppressing the attachment of the chemical liquid or the pure water to the edge surface of the top plate 60. Incidentally, the embodiment shown in FIG. 6 permits the top plate 60 to produce the greatest effect.

Arranged in the housing portion 44 are a window portion 48' and a third shutter 48 for opening-closing the window portion 48' by a driving mechanism (not shown). When the atmosphere within the housing portion 44 is isolated from the atmosphere within the outer chamber 43, the third shutter 48 is closed. On the other hand, a window portion 49' and a fourth shutter 49 for opening-closing the window portion 49' are arranged in the housing portion 45. In order to isolate the atmosphere within the housing portion 45 from the atmosphere within the outer chamber 43, the fourth shutter 49 is closed.

An arm 50 is housed in the housing portion 44, and two chemical liquid supply nozzles 51 and 52 are mounted to the arm 50. On the other hand, an arm 53 is housed in the housing portion 45, and two rinse-drying nozzles 54 and 55 are mounted to the arm 53.

Figure 8:
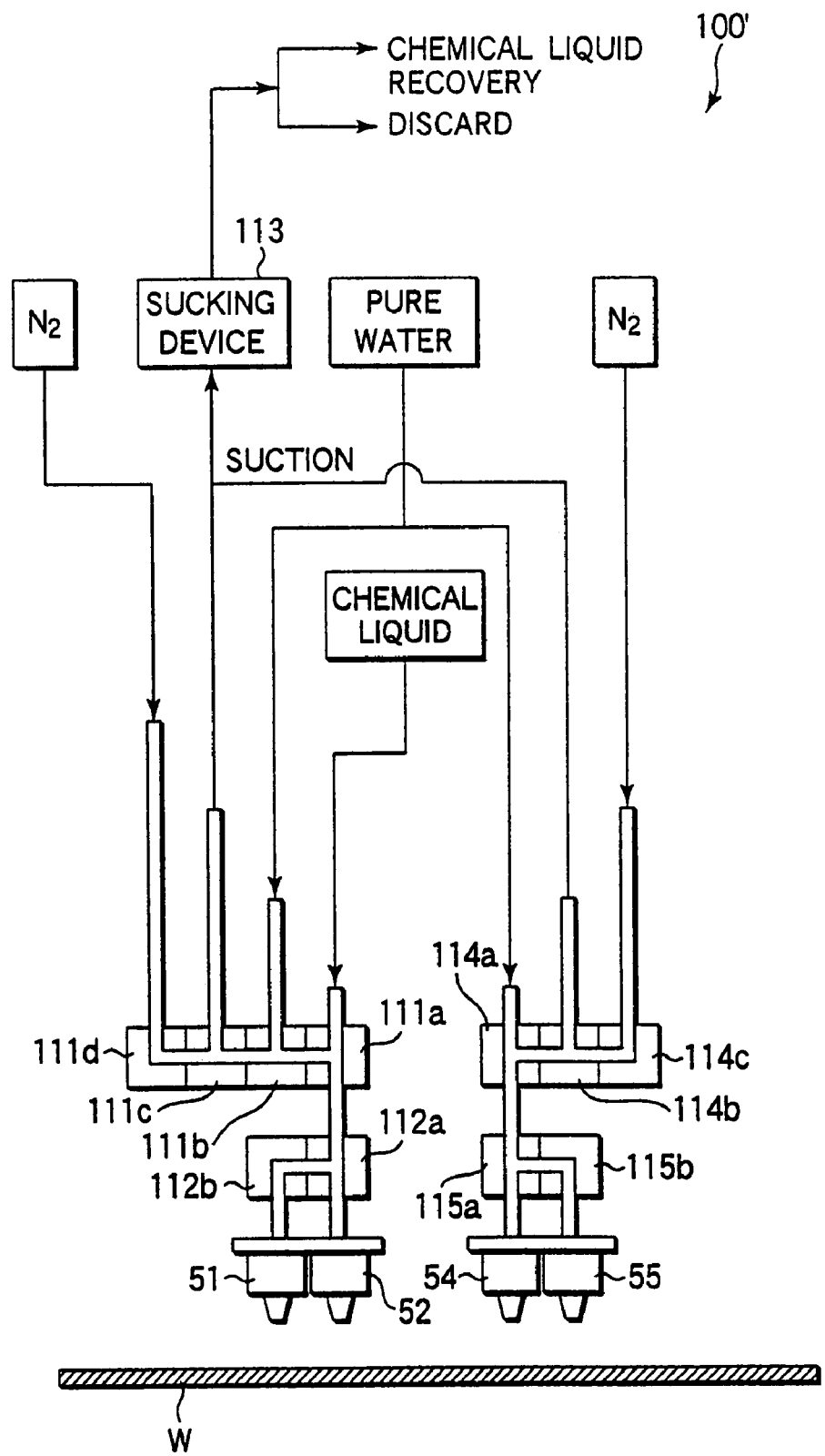
FIG. 8 schematically shows the constructions of a chemical liquid supply system for supplying, for example, a chemical liquid into a nozzle for supplying a chemical liquid and into a rinse-drying nozzle.

FIG. 8 schematically shows the construction of a chemical liquid supply system 100' for supplying a chemical liquid, etc. to the chemical liquid supply nozzles 51, 52 and the rinse-drying nozzles 54, 55. Mounted to the chemical liquid supply nozzles 51, 52 are a valve group consisting of two opening-closing valves 112*a*, 112*b* and another valve group consisting of four opening-closing valves 111*a*, 111*b*, 111*c* and 111*d*. A chemical liquid is supplied to the chemical liquid supply nozzles 51, 52 through the opening-closing valve 111*a*, a pure water is supplied to the chemical liquid supply nozzles 51, 52 through the opening-closing valve 111*b*, and a nitrogen gas is supplied to the chemical liquid supply nozzles 51, 52 through the opening-closing valve 111*d*. It should be noted that the operation of the opening-closing valves 112*a* and 112*b* is switched so as to permit a chemical liquid, etc. to be discharged from one of the chemical liquid supply nozzles 51 and 52.

A sucking device 113 such as an aspirator or a vacuum pump is mounted to a pipe to which the opening-closing valve 111*c* is mounted. It is possible to suck and remove the chemical liquid or pure water remaining inside the chemical liquid supply nozzle 52 by operating the sucking device 113 and opening the opening-closing valve 111*c* and the opening-closing valve 112*a* after the chemical liquid or the pure water is supplied into the chemical liquid supply nozzle 52. Likewise, it is possible to suck and remove the chemical liquid or the pure water remaining inside the chemical liquid supply nozzle 51 by operating the sucking device 113 and opening the opening-closing valve 111*c* and the opening-closing valve 112*b*. The chemical liquid thus sucked is recovered so as to be reused, or is discarded.

Mounted to the rinse-drying nozzles 54, 55 are a valve group consisting of two opening-closing valves 115*a*, 115*b* and another valve group consisting of three opening-closing valves 114*a*, 114*b* and 114*c*. A pure water is supplied into the rinse-drying nozzles 54, 55 through the opening-closing valve 114*a*. Likewise, a nitrogen gas is supplied into the rinse-drying nozzles 54, 55 through the opening-closing valve 114*c*. It should be noted that the operation of the opening-closing valves 115*a* and 115*b* is switched so as to permit a pure water or a nitrogen gas to be discharged from one of the rinse-drying nozzles 54 and 55.

The sucking device 113 is also connected to the opening-closing valve 114*b*. It is possible to suck and remove the pure water remaining inside the rinse-drying nozzle 54 by operating the sucking device 113 and opening the opening-closing valve 114*b* and the opening-closing valve 115*a* after the pure water is supplied into the rinse-drying nozzle 54. Likewise, it is also possible to suck and remove the pure water remaining inside the rinse drying nozzle 55 by operating the sucking device 113 and opening the opening-closing valve 114*b* and the opening-closing valve 115*b*. The pure water thus sucked is generally subjected to a prescribed processing and, then, is discarded.

Incidentally, in FIG. 8, flowing paths of a chemical liquid etc. are shown in respect of opening-closing valves 111*a* to 111*d*, 112*a*, 112*b*, 114*a* to 114*c*, 115*a* and 115*b* but the mechanisms for opening/closing these flowing paths are omitted. The supply sources of the chemical liquid, the pure water and the nitrogen gas for the chemical liquid supply system 100' can be commonly used as the supply sources of the chemical liquid, the pure water and the nitrogen gas for the chemical liquid supply system 100.

It is possible to permit the chemical liquid supply nozzles 51 and 52 to be moved into the outer chamber 43 so as to be scanned between at least the center and the peripheral portion of the wafer W held by the spin chuck 59 by swinging the arm 50. Also, the arm 50 can be housed in the housing portion 44 except the cleaning processing time of the wafer W. Since the housing portion 44 is kept put under the atmosphere of the chemical liquid, corrosion-resistant parts are used in the arm 50. Incidentally, it is desirable to permit the third shutter 48 to open and/or close the window portion 48' in accordance with the timing of the swinging operation of the arm 50.

It is possible to permit the rinse-drying nozzle 54 and 55 to be moved into the outer chamber 43 so as to be scanned between at least the center and the peripheral portion of the wafer W held by the spin chuck 59 by swinging the arm 53. The arm 53 is housed in the housing portion 45 except the cleaning processing time of the wafer W. Although the housing portion 45 is free from the atmosphere of a chemical liquid, it is desirable to use corrosion-resistant parts for forming the arm 53. Incidentally, it is also desirable for the fourth shutter 49 to open and/or close the window portion 49' in accordance with the timing of the swinging operation of the arm 53.

A cleaning device 56 for the chemical liquid supply system arm is arranged in the housing portion 44 so as to clean appropriately the chemical liquid supply nozzles 51, 52. The third shutter 48 is closed when the chemical liquid supply nozzles 51, 52 are cleaned. As a result, it is possible to prevent the atmosphere within the housing portion 44 from leaking into the housing 42 and the outer chamber 43. Also, a cleaning device 57 for the arm 53 is arranged in the housing portion 45 so as to clean appropriately the rinse-drying nozzles 54, 55. The fourth shutter 49 is closed when the rinse-drying nozzles 54, 55 are cleaned. As a result, it is possible to prevent the atmosphere within the housing portion 45 from leaking into the housing 42 and the outer chamber 43.

The cleaning processing of the wafer W performed by the cleaning processing system 1 will now be described.

Figure 9:
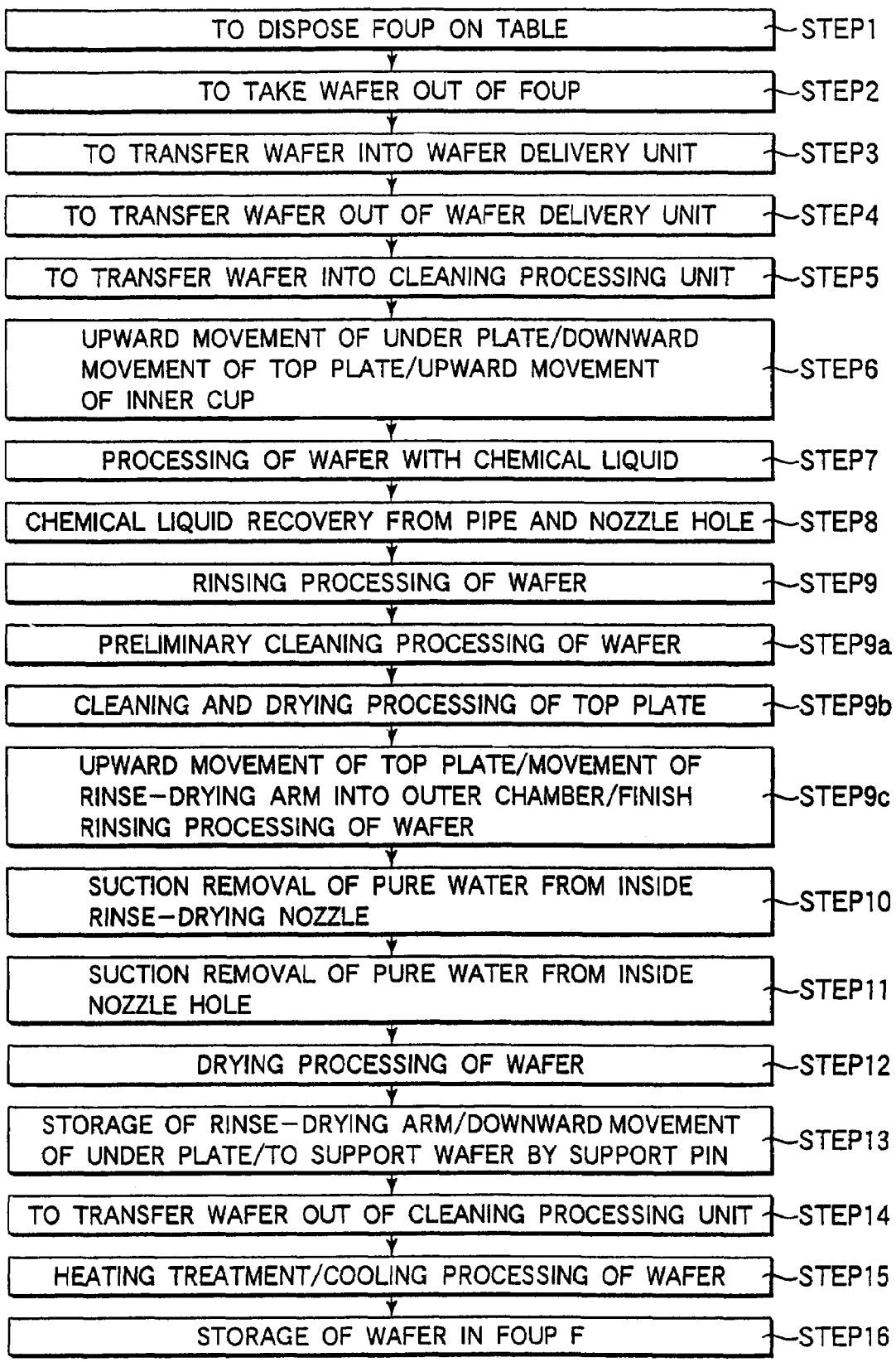
FIG. 9 is a flow chart schematically showing the process steps of the cleaning processing.

FIG. 9 is a flow chart schematically showing the steps of the cleaning process. In the first step, a FOUP F having uncleaned wafers W housed therein is disposed at a prescribed position on the table 6 of the in-out port 4 by a transfer robot or an operator (step 1). Then, the wafers W are taken out one by one from within the FOUP F disposed on the table 6 by the transfer pick 11 (step 2). The wafer W taken out of the FOUP F is transferred onto, for example, the wafer delivery unit (TRS) 16 (step 3).

In the next step, the main wafer transfer device 18 takes out the wafer W disposed on the wafer delivery unit (TRS) 16 by using any of the transfer arms 34 to 36, e.g., by using the transfer arm 34 (step 4), followed by transferring the wafer W into any of the cleaning processing units (CLN) 12 to 15, e.g., into the cleaning processing unit (CLN) 12 (step 5).

The operation of step 5 is carried out as follows. In the first step, the first shutter 46 mounted to the housing 42 and the second shutter 47 mounted to the outer chamber 43 are opened. Substantially simultaneously with or before the operation of opening the first shutter 46 and the second shutter 47, the inner cup 58 is held in the retreat position, the under plate 63 is put in a waiting state in a position close to the rotary plate 61, and the top plate 60 is put in a waiting state in the vicinity of the upper wall of the outer chamber 43. Then, the transfer arm 34 is moved into the outer chamber 43, and the wafer W is delivered from the transfer arm 34 onto the support pin 64a mounted to the spin chuck 59.

If the wafer W is supported by the support pin 64a, the transfer arm 34 is moved out of the outer chamber 43, followed by closing the first shutter 46 and the second shutter 47. Then, the inner cup 58 is moved upward so as to be held at the process position. Also, the under plate 63 is moved upward so as to maintain a prescribed space between the lower surface of the wafer W and the upper surface of the under plate 63, and the top plate 60 is moved downward so as to maintain a prescribed space between the upper surface of the wafer W and the lower surface of the top plate 60 (step 6).

Under the conditions described above, a processing of the wafer W with a chemical liquid is started (step 7). Where the processing with a chemical liquid is carried out without rotating the wafer W, the wafer W is held supported by the support pin 64a. On the other hand, where the processing with a chemical liquid is carried out while rotating the wafer W, and when a rinsing processing and a gas drying processing are applied to the wafer W while rotating the wafer W after the processing with a chemical liquid, the wafer W is held by the holding pin 64b before the wafer W is rotated.

The opening-closing valve 101a is opened under any of the states that both the wafer W and the top plate 60 are held stationary, that one of the wafer W and the top plate 60 is rotated and the other is held stationary, and that both the wafer W and the top plate 60 are rotated. Since a chemical liquid is discharged from the pipe 120 onto the surface of the wafer W if the opening-closing valve 101a is opened, a layer of the chemical liquid is formed between the wafer W and the top plate 60. The layer of the chemical liquid thus formed is retained for a prescribed time. Also, the opening-closing valve 102a is opened so as to cause the nozzle hole 75 to discharge a chemical liquid to the back surface of the wafer W. As a result, a layer of the chemical liquid is formed between the wafer W and the under plate 63 and is retained for a prescribed time. Incidentally, it is possible to supply, in addition, continuously or intermittently a suitable amount of the chemical liquid into the gap between the wafer W and the top plate 60 and into the gap between the wafer W and the under plate 63 during the processing with a chemical liquid.

During the processing with a chemical liquid, a nitrogen gas is supplied from the gas supply pipe 121 of the nitrogen gas into the clearance 85a formed between the pipe 120 and the hole portion 85. Also, the waste gas is exhausted from the gas exhaust pipe 122a (slow leak). The supply of the nitrogen gas and the exhaust of the waste gas are carried out such that the nitrogen gas is not spurted onto the layer of the chemical liquid formed between the wafer W and the top plate 60, and that the chemical liquid does not permeate into the clearance 85a. Incidentally, the chemical liquid dropping from the periphery of the wafer W during the processing with the chemical liquid is recovered through the drain 58a and, then, is subjected to a purifying treatment so as to be reused.

After completion of the processing with the chemical liquid, the opening-closing valve 101a is closed so as to stop the discharging of the chemical liquid onto the surface of the wafer W. Then, the sucking device 103b is operated and the opening-closing valve 101c is opened. As a result, the chemical liquid remaining inside the pipe 120 is sucked and removed. The chemical liquid thus sucked is recovered so as to be reused. Likewise, the opening-closing valve 102a is closed so as to stop the supply of the chemical liquid to the back surface of the wafer W. Then, the sucking device 103a is operated and the opening-closing valve 102c is opened. As a result, the chemical liquid remaining inside the nozzle hole 75 is sucked and recovered (step 8). Compared with the case where the chemical liquid remaining inside the pipe 120 and the nozzle hole 75 is pushed out with a pure water so as to be recovered through the drain 58a formed in the bottom portion of the inner cup 58, the particular recovery process of the chemical liquid described above permits recovering the chemical liquid that is less stained at a high concentration and, thus, the recovered chemical liquid can be reused easily.

After completion of the recovery process of the chemical liquid, the opening-closing valves 101c and 102c are closed. Also, after the inner cup 58 is moved downward to the retreat position, the rinsing processing is applied for removing the chemical liquid from the wafer W. During the rinsing processing, the top plate 60 is washed simultaneously with water.

The rinsing processing can be applied to the surface of the wafer W by, for example, applying a preliminary cleaning to the wafer W while cleaning the top plate 60 with water, and by applying a final rinsing processing to the wafer W by using one of the rinse-drying nozzles 54 and 55. In this case, the rinsing processing is carried out by opening the opening-closing valve 101b so as to permit a pure water to be discharged from the pipe 120 onto the wafer W while rotating the top plate 60 and the wafer W at a prescribed low rotating speed, thereby forming a layer of the pure water between the top plate 60 and the wafer W and allowing a prescribed amount of the pure water to drop from the pure water layer (step 9a).

A prescribed time later, the opening-closing valve 101b is closed so as to stop the discharging of the pure water. Then, the opening-closing valve 101d is opened so as to permit a prescribed amount of a nitrogen gas to be discharged from the pipe 120, thereby forming a nitrogen gas reservoir in the vicinity of the lower end of the pipe 120. Then, the rotating speed of the top plate 60 is increased. When the rotating speed of the top plate 60 exceeds substantially 100 rpm during the process of increasing the rotating speed of the top plate 60, the exhaust route from the clearance 85a is switched from the gas exhaust pipe 122a to the gas exhaust pipe 122b. At the time when a compulsory exhaust from the gas exhaust pipe 122b is carried out, a pure water is not sucked from the clearance 85a because the pure water layer formed between the top plate 60 and the wafer W is already collapsed. The particles generated in the clearance 85a by the rotation of the top plate 60 and the holding member 70 are prevented from falling down by the compulsory exhaust noted above, with the result that the particles are prevented from being attached to the wafer W.

Then, the rotating speed of the top plate 60 is increased to a prescribed level and maintained at the prescribed level for a prescribed time. As a result, the pure water attached to the top plate 60 is centrifugally removed (step 9b). Incidentally, it is possible to permit a nitrogen gas to be spurted continuously from the pipe 120 during a spin drying processing applied to the top plate 60, i.e., while the top plate 60 is being dried by the centrifugal removal of the pure water. It is also possible to operate the sucking device 103b and open the opening-closing valve 101c during the spin drying processing or after the spin drying processing applied to the top plate 60, thereby sucking and removing the pure water remaining inside the pipe 120. Since the inner region of the pipe 120 is dried in this fashion in the present invention, it is possible to prevent the droplet of the pure water from dripping from the pipe 120 onto the wafer W.

After completion of the water washing processing of the top plate 60, the top plate 60 is moved upward, and the fourth shutter 49 is opened, followed by moving the arm 53 into the inner cup 58 (step 9c). Then, while the wafer W is rotated at a prescribed rotating speed, the opening-closing valves 114a and 115a are opened so as to discharge a pure water from the rinse-drying nozzle 54 onto the surface of the wafer W while swinging the arm 53 between substantially the center and the periphery of the wafer W. As a result, a rinsing processing is applied more precisely to the surface of the wafer W.

Simultaneously with the rinsing processing applied to the front surface of the wafer W by the pipe 120 and the rinse-drying nozzle 54 described above, a rinsing processing is also applied to the back surface of the wafer W by opening the opening-closing valve 102b so as to discharge a pure water from the nozzle hole 75 to the back surface of the wafer W. In this case, in order to permit the pure water from being discharged onto the entire region of the back surface of the wafer W, a pure water layer is formed between the wafer W and the under plate 63, and a prescribed amount of the pure water is allowed to flow down from the pure water layer. The chemical liquid or the pure water scattered from the wafer W during the rinsing processing are recovered through the drain 43a or are discarded.

After completion of the rinsing processing, the opening-closing valve 114a is closed, with the opening-closing valve 115a held open, the sucking device 113 is operated, and the opening-closing valve 114b is opened. In this fashion, the pure water remaining inside the rinse-drying nozzle 54 is sucked and removed (step 10). As a result, in the subsequent step of the drying processing of the wafer W, the pure water droplet is prevented from falling down from the rinse-drying nozzle 54 onto the wafer W. It is also possible to prevent a mist of the pure water from being mixed with the nitrogen gas. It follows that it is possible to prevent the water mark generation on the surface of the wafer W.

After or substantially simultaneously with the removal of the pure water from the rinse-drying nozzle 54, the sucking device 103a is operated and the opening-closing valve 102c is opened. As a result, the pure water remaining inside the nozzle hole 75 is sucked and removed (step 11). Since the nozzle hole 75 extends in the vertical direction, the direction of the gravitational force exerted on the pure water remaining inside the nozzle hole 75 is equal to the direction of the sucking force produced by the sucking device 103a. It follows that the pure water can be effectively removed by the sucking device 103a so as to make it possible to eliminate substantially completely the attachment of the pure water to the wall of the nozzle hole 75. Incidentally, it is possible to carry out the processing in step 11 under the state that the wafer W is held stationary or under the state that the wafer W is rotated at a low rotating speed, e.g., at 100 rpm or lower.

In the next step, a drying processing is applied to the wafer W by allowing a nitrogen gas to be spurted from the rinse-drying nozzle 54 onto the front surface of the wafer W and by allowing a nitrogen gas to be spurted from the nozzle hole 75 to the back surface of the wafer W while rotating the wafer W at a prescribed rotating speed (step 12). In the drying processing applied to the front surface of the wafer W, a mist of a pure water is not mixed with the nitrogen gas spurted from the rinse-drying nozzle 54 because the pure water is removed in advance from within the rinse-drying nozzle 54, with the result that it is possible to prevent the water mark generation on the surface of the wafer W. Likewise, it is possible to prevent the water mark generation on the back surface of the wafer W in the drying processing applied to the back surface of the wafer W because the pure water remaining inside the nozzle hole 75 is removed in advance and, thus, a mist of a pure water is not mixed with the nitrogen gas spurted from the nozzle hole 75.

In discharging a nitrogen gas onto the front surface of the wafer W, it is possible to swing the arm 53 such that the tip of the arm 53 is reciprocated between substantially the center and the periphery of the wafer W. In this case, if a nitrogen gas supplied from the gas supply port 86 is introduced into the outer chamber 43 so as to establish a nitrogen gas atmosphere, the scanning effect of the arm 53 permits further improving the effect of suppressing the water mark generation.

Figure 10:
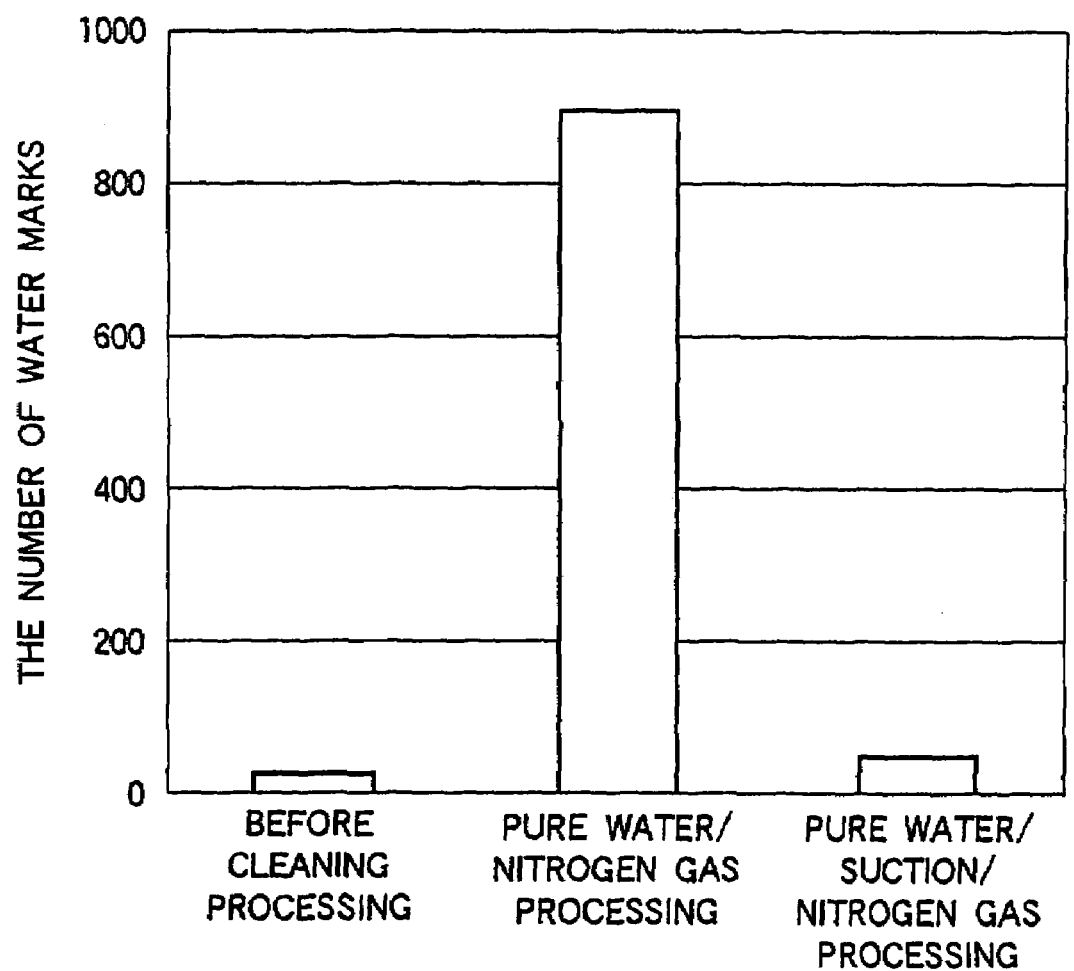
FIG. 10 shows the relationship between the method of removing the pure water remaining inside the nozzle hole after the rinsing process and the number of water marks generated on the back surface of a wafer W after the dry processing.

FIG. 10 is a graph showing the difference in the number of water marks generated on the back surface of the wafer W after the drying processing among the methods of removing the pure water remaining inside the nozzle hole 75 after the rinsing processing.

The item "before cleaning processing" in FIG. 10 represents the number of water marks (the number of particles) on the back surface of the wafer W before the cleaning processing was applied by using the cleaning processing apparatus 1.

The item "pure water/nitrogen gas processing" in FIG. 10 represents the number of water marks in the case where the pure water within the nozzle hole 75 was extruded toward the back surface of the wafer W by opening the opening-closing valve 102d and introducing a nitrogen gas into the nozzle hole 75, followed by discharging a nitrogen gas from the nozzle hole 75 toward the wafer W so as to apply a drying processing to the back surface of the wafer W. In this case, a large number of water marks were observed on the back surface of the wafer W. It is considered reasonable to understand that, since the direction of the gravitational force applied to the pure water is opposite to the direction of the force applied from the nitrogen gas to the pure water, the pure water is likely to be attached to the inner wall of the nozzle hole 75 in the form of a water droplet. What should be noted is that the water droplet attached to the inner wall of the nozzle hole 75 is converted into a mist by the discharging of a nitrogen gas in the back surface drying step of the wafer W. Naturally, the mist of the water is spurted toward the back surface of the wafer W so as to be attached to the dried portion of the wafer W, thereby bringing about the water mark generation.

FIG. 10 also shows an item "pure water/suction/nitrogen gas processing". This item represents the experimental data in the case where the pure water remaining inside the nozzle hole 75 was removed (suction removal of the pure water) as in step 11 described above, followed by applying a drying processing to the back surface of the wafer W by discharging a nitrogen gas from the nozzle hole 75 toward the wafer W. It is clearly shown in FIG. 10 that the number of water marks in this case is markedly decreased, compared with the case of the "pure water/nitrogen gas processing". It is considered reasonable to understand that, since the pure water is scarcely attached to the inner wall of the nozzle hole 75 as described previously, a mist of a pure water is not mixed with the nitrogen gas so as to suppress the water mark generation on the back surface of the wafer W.

After completion of the drying processing, the arm 53 is housed in the housing portion 45, the under plate 63 is moved downward, and the wafer W is transplanted from the holding pin 64b onto the support pin 64a (step 13). Then, the first shutter 46 and the second shutter 47 are opened so as to permit, for example, the transfer arm 34 to be moved into the outer chamber 43, thereby transplanting the wafer W supported by the support pin 64a onto the transfer arm 34. After the transfer arm 34 holding the wafer W is retreated from within the cleaning processing unit (CLN) 12, the first shutter 46 and the second shutter 47 are closed (step 14).

The wafer W transferred out of the cleaning processing unit (CLN) 12 is transferred into any of the hot plate units (HP) 19, 20 and 21 so as to receive a heat treatment and, then, is further transferred as required into the cooling unit (COL) 22 so as to receive a cooling processing (step 15). Further, the wafer W is transferred by the main wafer transfer device 18 onto the wafer delivery unit (TRS) 17 so as to be disposed thereon. Still further, the transfer pick 11 takes out the wafer W disposed on the wafer delivery unit (TRS) 17 so as to permit the wafer W to be housed in the original slot of the FOUP F having the wafer W housed therein previously (step 16).

The technical scope of the present invention is not limited to the embodiment of the present invention described above. In the embodiment described above, the front surface of the wafer W was processed with a chemical liquid by using the discharging nozzle having the top plate 60 and the pipe 120. However, the processing with a chemical liquid can also be performed by operating the arm 50.

In performing the processing with a chemical liquid in the case of using the arm 50, the third shutter 48 is opened, and the arm 50 is swung to permit the tip of the arm 50 to be positioned on substantially the center of the wafer W. Then, any of methods (1) and (2) given below can be suitably employed:

(1) A chemical liquid is supplied from the chemical liquid supply nozzle 51 (or 52) onto the surface of the wafer W so as to forms a puddle of the chemical liquid on the surface of the wafer W, and the puddle thus formed is retained for a prescribed time.

(2) The arm 50 is swung to permit the tip thereof to be reciprocated between substantially the center and the periphery of the wafer W while rotating the wafer W at a prescribed rotating speed and while discharging a chemical liquid from the chemical liquid supply nozzle 51 (or 52) onto the wafer W.

After the supply of a chemical liquid is finished, the opening-closing valve 111a is closed, the opening-closing valve 111c is opened, and the sucking device 113 is operated. As a result, the chemical liquid remaining inside the chemical liquid supply nozzle 51 (or 52) is sucked and recovered. Then, the opening-closing valve 111c is closed and the opening-closing valve 111b is opened substantially simultaneously with the time when the wafer W is rotated at a prescribed rotating speed. As a result, a pure water is supplied from the chemical liquid supply nozzle 51 (or 52) onto the front surface of the wafer W so as to carry out the rinsing processing of the wafer W. In this case, it is possible to swing the arm 50 so as to permit the tip of the arm 50 to be reciprocated between the center and the periphery of the wafer W.

After the discharging of the pure water from the chemical liquid supply nozzle 51 (or 52) is finished, the opening-closing valve 111b is closed, the opening-closing valve 111c is opened, and the sucking device 113 is operated. As a result, the pure water remaining inside the chemical liquid supply nozzle 51 (or 52) is sucked and removed. Then, the arm 50 is housed in the housing portion 44, and the finish rinsing processing is performed by using the arm 53 as described previously.

Incidentally, it is possible for the corrosive power of a chemical liquid to be increased by the mixing of the chemical liquid with a pure water. In such a case, in starting the rinsing processing, it is desirable to cleaning away most of the chemical liquid by supplying IPA onto the surface of the wafer W before the pure water is supplied, followed by supplying the pure water onto the wafer W. By this processing, it is possible to suppress the corrosion, etc. of various parts within the outer chamber 43. IPA can be supplied easily to the discharging nozzle 81 for cleaning the front surface of the wafer W, the discharging nozzle 82 for cleaning the back surface of the wafer W and the chemical liquid supply nozzles 51, 52 by arranging opening-closing valves and pipes.

The present invention is not limited to a cleaning apparatus and can be applied to the apparatus for carrying out a liquid processing of a substrate by using various process liquids. Incidentally, the substrate cleaned by the apparatus and the method of the present invention is not limited to a semiconductor wafer. In other words, the apparatus and method of the present invention can be used for cleaning other substrates such as a glass substrate for an LCD and a ceramic substrate.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

What is claimed is:

1. A liquid processing method for supplying a process liquid onto a substrate so as to carry out a liquid processing, the method comprising:
   discharging a process liquid in a discharge direction from a discharge port of a discharging nozzle, which is configured to discharge a process liquid and a drying gas, onto the substrate, thereby applying a liquid processing to a substrate;
   then sucking the process liquid remaining inside the discharging nozzle in a direction substantially opposite to the discharge direction, thereby removing the process liquid from inside the discharging nozzle toward a side upstream from the discharge port; and
   then, discharging the drying gas in the discharge direction from the discharge port of the discharging nozzle, thereby drying the substrate.

2. The liquid processing method according to claim 1, wherein:
   the discharging nozzle includes a first nozzle portion for discharging a process liquid and a drying gas onto the front surface of the substrate and a second nozzle portion for discharging a process liquid and a drying gas to the back surface of the substrate; and
   the front surface and the back surface of the substrate are simultaneously subjected to the liquid processing in applying the liquid processing to the substrate.

3. The liquid processing method according to claim 2, wherein in applying the liquid processing to the substrate, the back surface of the substrate is subjected to the liquid processing by arranging a plate member in a manner to face the back surface of the substrate with a prescribed space provided therebetween, and by forming a layer of the process liquid between the substrate and the plate member.

4. The liquid processing method according to claim 3, wherein in applying the liquid processing to the substrate, the front surface of the substrate is subjected to the liquid processing by arranging another plate member in a manner to face the front surface of the substrate with a prescribed space provided therebetween, and by forming a layer of the process liquid between the substrate and said another plate member.

5. The liquid processing method according to claim 4, wherein said another plate member is rotated after completion of the liquid processing applied to the front surface of the substrate thereby removing the process liquid attached to said another plate member.

6. The liquid processing method according to claim 1, wherein said drying the substrate is carried out while rotating the substrate.

7. The liquid processing method according to claim 1, wherein the process liquid removed from within the discharging nozzle is recovered and reused.

* * * * *